United States Patent [19]
Stoft

[11] Patent Number: 5,107,233
[45] Date of Patent: Apr. 21, 1992

[54] AMPLITUDE CORRECTION OF FIELD COUPLED VARACTOR TUNED FILTERS

[75] Inventor: David E. Stoft, Bellingham, Wash.

[73] Assignee: Hewlett-Packard Company, Palo Alto, Calif.

[21] Appl. No.: 597,986

[22] Filed: Oct. 15, 1990

[51] Int. Cl.[5] .............................................. H03H 7/00
[52] U.S. Cl. ................................... 333/168; 333/174; 333/175; 333/185
[58] Field of Search .............................. 333/202–205, 333/235, 167, 168, 174, 175, 180, 185, 212, 230; 455/289, 338, 339, 307

[56] References Cited

U.S. PATENT DOCUMENTS

| | | | |
|---|---|---|---|
| 3,277,406 | 10/1966 | Ocker | 333/202 |
| 3,715,690 | 2/1973 | Young et al. | 333/202 X |
| 4,760,535 | 7/1988 | Englmeier | 455/197 X |
| 4,839,617 | 6/1989 | Speake | 333/175 X |
| 4,970,479 | 11/1990 | Landt et al. | 333/202 X |

FOREIGN PATENT DOCUMENTS 0552654  4/1977  U.S.S.R. ............................. 333/204

OTHER PUBLICATIONS

Walters et al, "Helical filters with PIN-diode Q-control for Pre-converter AGC, Conference on Radio Receivers & Associated Systems", Jul. 1972, pp. 61–67.

Primary Examiner—Eugene R. LaRoche
Assistant Examiner—Seung Ham

[57] ABSTRACT

In a multi-stage, varactor-tuned bandpass filter utilizing electromagnetic field coupling between successive filter stages, the effective area of a coupling window provided in the RF shielding separating the filter stages is varied as a function of the varactor tune voltage to provide a flat frequency response over the filter frequency range. The bias current through a PIN diode connected across the coupling window is controlled by varactor tune voltage to effectively decrease the window area with increasing filter frequency.

11 Claims, 5 Drawing Sheets

AMPLITUDE CORRECTION OF FIELD COUPLED VARACTOR TUNED FILTERS

BACKGROUND OF THE INVENTION

The present invention relates generally to multi-stage, field-coupled high frequency radio frequency (RF) filters and, more particularly, to multi-stage, field-coupled filters wherein the coupling window effective area is controlled as a function of frequency to provide a flat filter response over the filter tuning range.

Multi-section, varactor-tuned RF bandpass filters utilizing electromagnetic coupling between the filter stages are well-known in the art. However, for prior art field-coupled filters, a single physical adjustment of the coupling factor allows relatively small, typically, ten percent, frequency tune ranges. Further, inter-stage coupling at high frequencies, greater than 500 MegaHertz (MHz), for example, is difficult to control, and an adjustable but fixed coupling performs poorly over wide frequency range such as a 2:1 frequency span.

Tapped inductor and loop-coupled filters have very position-sensitive elements with respect to filter parameters such as insertion loss. Construction of physically smaller, lower-impedance loops reduces this sensitivity, but at the cost of substantial increases in frequency-dependent insertion loss. Electromagnetic field coupling between the filter stages is achieved by opening a physical "window" through the shield isolating the filter stages from one another thus allowing propagation of the filter inductor electromagnetic field. Electrical models of field-coupled filters are extremely complex; however, final physical designs can typically be easily reproduced with repeatable results.

Field coupling, similar to loop coupling, affects filter response shape, filter Q and insertion loss. Adjustment of the coupling window position, with respect to the inductor or resonator, will modify the filter response shape. Capacitive field coupling results from utilizing the electromagnetic field produced near the high impedance end of the resonant circuit while inductive coupling is associated with the low impedance end. A balance between the capacitive and inductive fields yields a relatively symmetrical filter frequency response. Further, adjustment of the coupling window area changes the amount of coupling and therefore changes the insertion loss and, to a lesser degree, the filter Q.

SUMMARY OF THE INVENTION

In a multi-stage, varactor-tuned, field-coupled RF filter constructed according to the principles of the present invention, a DC voltage applied to the varactor diode controls the resonant frequency of each filter stage where, typically, an increasing voltage causes a decreasing capacitance, thus shifting the resonant frequency higher. As the resonant frequency increases, the efficiency of the electromagnetic coupling via the coupling window or port increases, thus increasing signal amplitude with increased frequency. A PIN diode is coupled across the coupling window (physical break) in the filter interstage shielding. A DC current applied to the PIN diode lowers the diode RF impedance to a few ohms thus shunting coupling port RF fields to ground and effectively decreasing the window coupling area. Utilizing the resonant circuit varactor tune voltage to provide a positive bias current for the PIN diode, the PIN diode impedance, and the coupling window effective area, may be controllably varied. Thus, the filter insertion loss may be varied as a function of the filter tune voltage. A variable resistor, in series with the DC control line of the PIN diode provides adjustment of a tune curve set point for the PIN diode bias current over the desired filter frequency range.

In the preferred embodiment, the varactor control voltage is provided by a central microprocessor via a digital-to-analog convertor (DAC) which provides a capability for synchronized, microprocessor control of the filter amplitude as the filter frequency is automatically adjusted over the filter frequency range. Thus, voltage-tuned filters can be automatically corrected for amplitude errors over broad frequency ranges eliminating prior art mechanical adjustments, typically a brass screw protruding into the coupling window shorting a portion of the field to ground. Filter self-correction also reduces or eliminates the need for complex external amplitude correction schemes such as broad-band variable attenuators.

The design of the present invention is simple and relatively easy to implement. A variable resistor provides additional means of adjustment to optimize the amplitude correction over a desired frequency range. If the filter is constructed on a printed circuit board, having an external, shielded enclosure grounded to the printed circuit board, the PIN diodes and variable resistor may be easily mounted to the same circuit layer as the resonant circuit components.

BRIEF DESCRIPTION OF THE DRAWING

A fuller understanding of the present invention will become more apparent from the following detailed description taken in conjunction with the accompanying drawings which form a part of the specification and in which.

DETAILED DESCRIPTION OF THE PREFERRED EMBODIMENT

Figure 1:
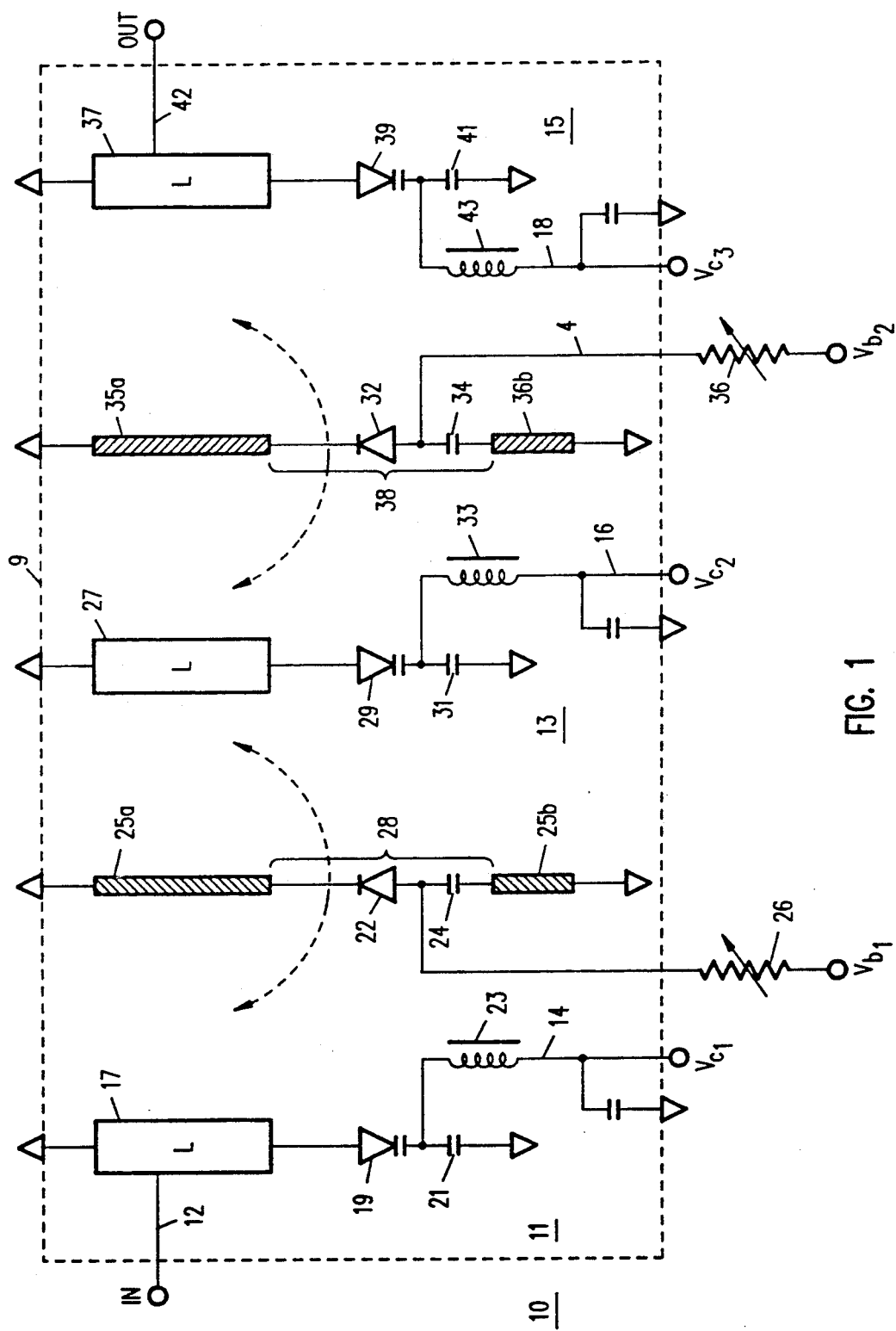
FIG. 1 is a block diagram of a multi-stage, field coupled RF filter in accordance with the principles of the present invention.

Referring to FIG. 1, a block diagram of a three stage field-coupled RF filter 10 constructed in accordance with the principles of the present invention is shown. The first stage 11 comprises a large surface area, high Q inductor 17 in series with a varactor 19 providing variable capacitance to form a resonant circuit having a selectable frequency. A DC control voltage $V_{c1}$, on line 14 is coupled via RF choke 23 to the varactor 19 to provide tuning of the filter. Similarly, the second and third filter stages 13, 15 comprise inductors 27, 37 in series with varactors 29, 39 respectively. The first and second stages 11, 13 are physically separated by an RF shield 25 and the second and third stages are separated by RF shield 35. The input signal on line 12 is connected to a tap on the first stage inductor 17 and the filtered signal is output from a tap on the third stage inductor 37 via line 42. Interstage coupling between the first and second stages, 11, 13 is provided by electromagnetic field-coupling via a physical gap, port or window 28 formed in the shield between shield sections 25a and 25b. Similarly, a window 38 formed by shield sections 35a and 36b provides field coupling between the second and third stages 13, 15. All shielding is grounded via low RF impedance connections to a common chassis ground 9.

Since it is highly desireable that the filter gain be flat over the entire frequency tune range, the increase in gain with frequency inherent with field coupling requires compensation. In filters of this type, either the use of a variable tap point on the inductor to control the level of the input signal or control of the field coupling gain directly may be used to compensate for the decreasing loss with increasing frequency. A variable tap, particularly when used with the physically short inductors found at high frequencies is extremely difficult and expensive to implement and reproduce. However, the degree of field coupling is easily controlled utilizing the variable impedance of a PIN diode connected between the shield sections 25a, 25b to vary the effective size of the coupling window 28. To control the field coupling between the first and second stages 11, 13, PIN diode 22 is connected between the shield sections 25a, 25b. Similarly, to control the field coupling between the second and third stages, 13, 15, PIN diode 32 is connected between the shield sections 35a and 36b. Since the PIN diodes 22, 32 can only restrict, i.e., reduce the amount, of the field coupling between the stages, the physical dimensions for the coupling windows 28, 38 must be selected to provide minimum insertion loss at the filter lower frequency limit, 500 MHz in the preferred embodiment.

Figure 2:
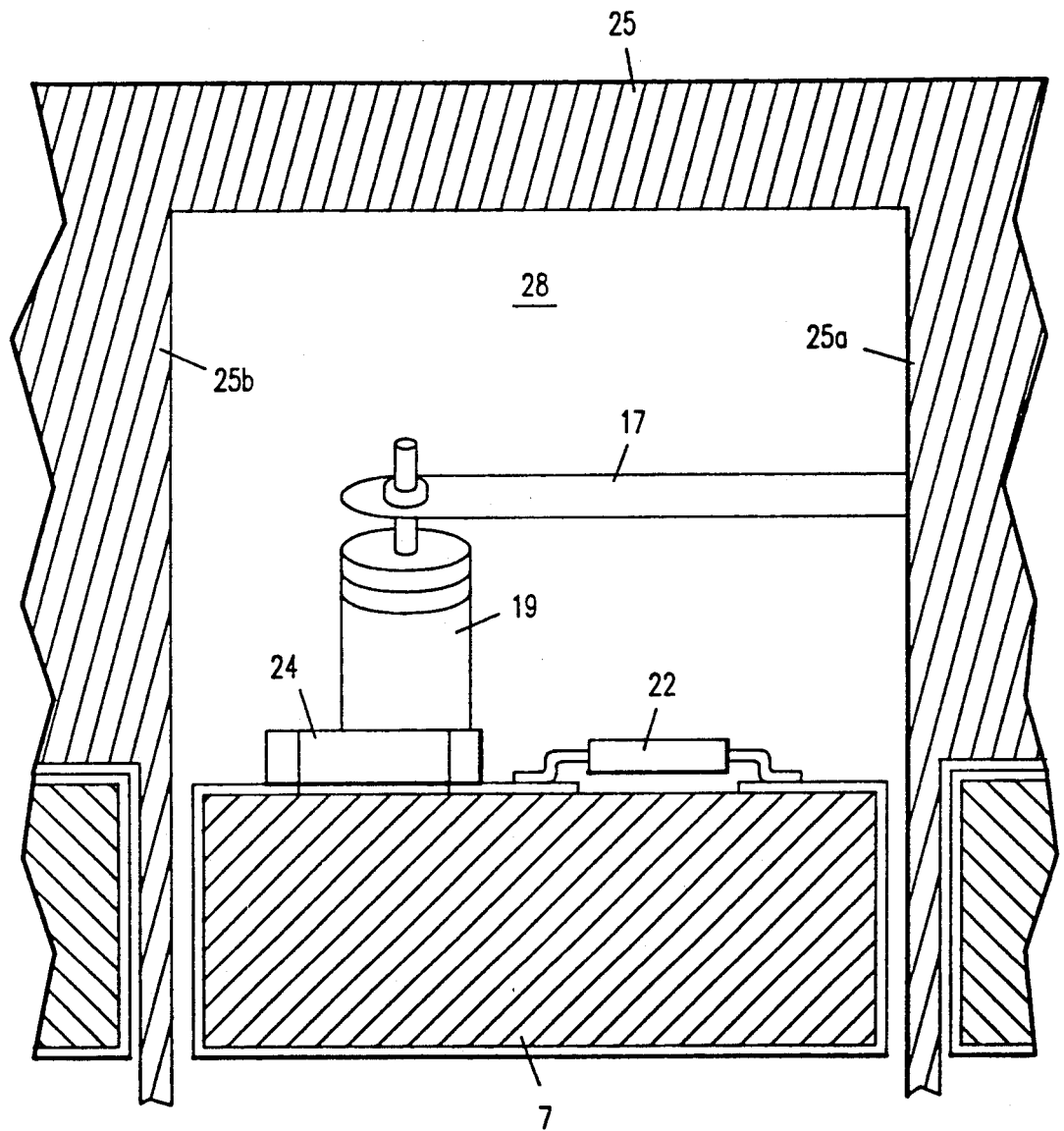
FIG. 2 is a diagram illustrating the physical placement of the circuit components on a PC board for the field-coupled filter sections constructed as shown in FIG. 1.

Referring now also to FIG. 2, the physical placement of the various circuit components relative to the coupling port 28 is shown (component placement for coupling port 38 is similar). The PIN diodes 22, 32 along with DC blocking capacitors 24, 34 must be physically mounted on PC board 7 in the windows, 28, 38 directly between the shield portions while keeping the series inductance as low as possible. As the bias current through the PIN diodes 22, 32 is increased, the PIN diode impedance is decreased thus shorting or shunting a portion of the coupling RF field, a portion of which flows through the PC board dielectric, and thus decreasing the effective size of the coupling windows 28, 38.

The voltage $V_{b1}$, $V_{b2}$ to drive the PIN diodes 22, 32 bias current is provided on lines 2 and 4, respectively. Variable resistors 26 and 36 provide an adjustment for the individual filter stages to set the PIN diode current range which optimizes the respective filter stage frequency response and gain flattening over the entire frequency range for the filter. The PIN diode bias voltage required is a function of the filter tune frequency and is controlled by the host instrument processor or by a separate processor to insure desired filter frequency response over the frequency range. The bias voltages may be provided by tuning algorithms which complement the filter tuning control voltage, $V_{c1}$, $V_{c3}$, to produce a desired frequency response for the filter. Alternatively, the bias voltage $V_{b1}$, $V_{b2}$ may be derived from the respective filter stage varactor control voltage $V_{c1}$, $V_{c3}$, on lines 14 and 18, respectively. The variable resistor 26 may be coupled between RF choke 23 and PIN diode 22 anode for the first stage 11 and variable resistor 36 may be coupled between RF choke 43 and PIN diode 32 anode for the third stage 15 to provide the bias for each individual filter stage.

Figure 3:
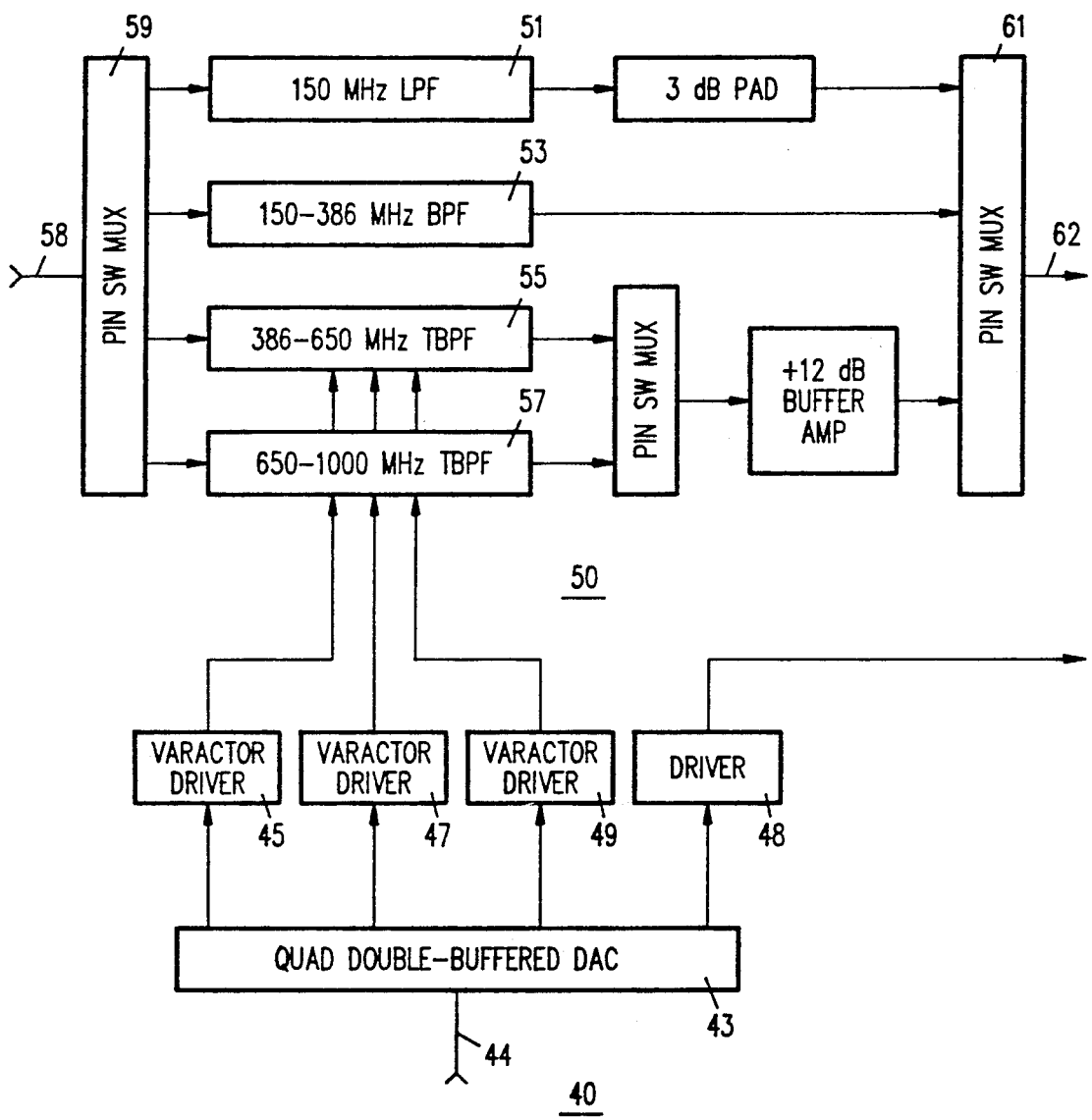
FIG. 3 is a block diagram of a multi-band filter circuit incorporating the field-coupled filter shown in FIG. 1.

Referring now to FIG. 3, a block diagram of a multiband RF filter utilized in an RF signal interface for a general purpose RF signal measurement and test instrument as described in copending patent application entitled "RADIO FREQUENCY SIGNAL INTERFACE" assigned to the instant assignee is shown. The multiband filter 50 comprises four filter sections 51, 53, 55, 57 an input multiplexer 59 and an output multiplexer 61. The input signal on line 58 is coupled to the appropriate bandpass filter section via multiplexer switch 59 and output on line 62 via multiplexer switch 61. The lowend filter section 51 comprises a sixth order 150 MHz passive tuned lowpass filter and the midband filter 53 comprises a 150-386 MHz passive tuned bandpass filter. The two high frequency tuned bandpass filters 55, 57 cover the frequency range from 386 MHz to 1000 MHz and are implemented as multi-stage, field-coupled filters as shown in FIG. 1. The varactor drive voltage for each of the tuned bandpass filters 55, 57 is provided by varactor drive circuit 40 derived from an automatic frequency control signal from a central processor (not shown) on line 44. The microprocessor generated digital control signal is coupled via DAC 43 and varactor drivers 45, 47, 49 to the individual filter stages of the tuned bandpass filters 55, 57. Driver 48 couples a correction voltage to other sections of the RF signal interface (not shown) not material to the present invention.

Figure 4:
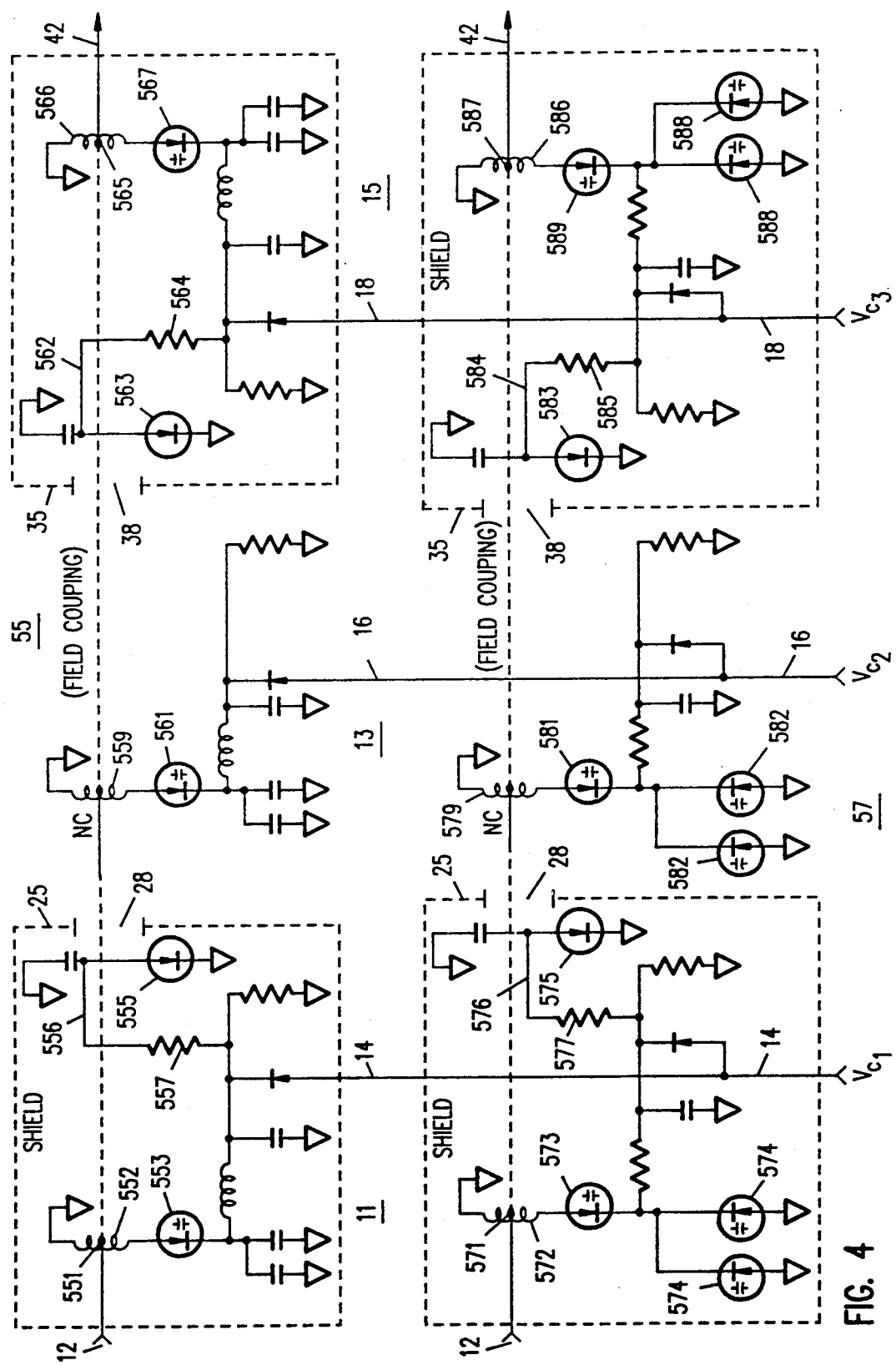
FIG. 4 is a schematic diagram of a pair of field-coupled filter sections as constructed in FIG. 1.
Figure 5:
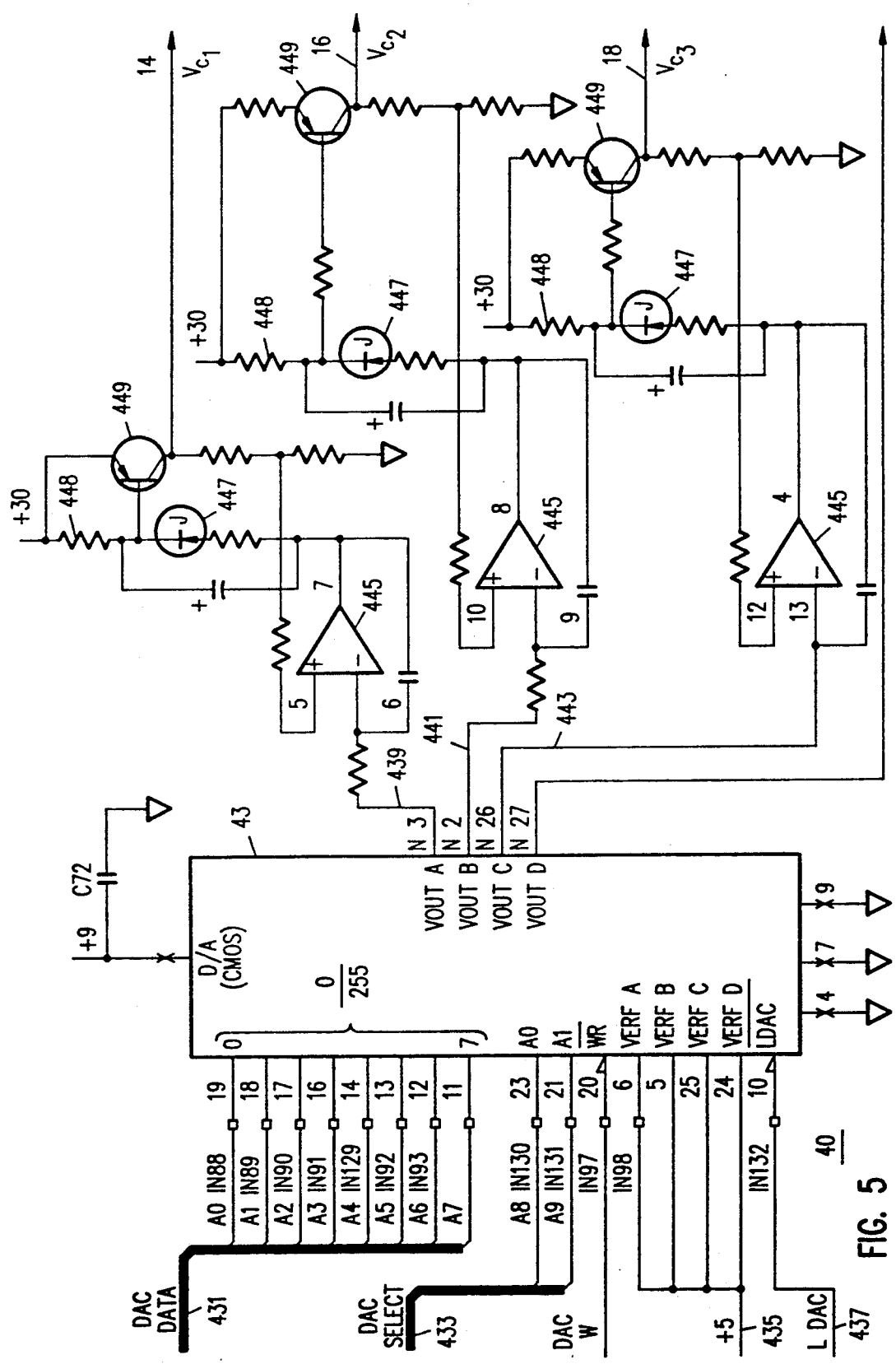
FIG. 5 is a schematic diagram of the filter varactor driver circuit shown in FIG. 3.

Referring now also to FIG. 4, both tuned bandpass filters 55, 57 have essentially the same design. Each filter 55, 57 comprises a three-stage, three pole, field-coupled, air core, varactor tuned bandpass filter. Input and output coupling is achieved by nominal 50 ohm taps 551, 571 and 565, 587 on the inductors 552, 572 and 566, 586, respectively. These inductors, including inductors 559 and 579, are etched, gold plated, copper "arcs" mounted in air to improve Q and lower the insertion loss. The series varactors 553, 573, 561, 581, 567, 589 are low-capacitance, hyper-abrupt type, such as BB405B. The shields 25, 35 are etched, gold plated, copper with identical port (window) openings 28, 38.

The second stage 13 does not have a cover, but only to reduce part types and assembly complexity as the entire filter assembly 55, 57 is enclosed by another shield enclosure. The shields 25, 35 are formed by an etched, gold plated copper cover, plus a "wall" formed by PC board with 6 wiring lay with layer 6 (back-side ground plane) ground vias connecting layer 6 to layer 1 (top) where the shields 25, 35 are mounted. The FR-4 PC board material (epoxy glass) within the filter cavity has the copper removed from layers 1 through 5 except for a internal ground pattern below the shield 25, 35 walls designed to minimize ground inductance in the high range (650-1000 MHz) filter section 57.

The cavity electromagnetic fields couple from one stage to the other via the opening, or window 28, 38, in one wall of the shield 25, 35. The windows are all centered on the shield wall and all are of substantially identical size to provide simplicity of fabrication of the shielding and PC board components. Window area primarily determines the degree of coupling (and thus insertion loss) but the window position also affects the type of coupling. If the window is positioned toward the grounded or low impedance end of the inductor, the coupling will be predominately inductive and will demonstrate response similar to a tapped inductor coupling.

The inductive coupling produces an asymmetrical response where frequencies below resonance are attenuated less and frequencies above resonance are attenuated more. Similarly, coupling energy from the high impedance end of the filter produces predominately capacitive coupling and thus the reverse effect. In the preferred embodiment, window size and positioning is a compromise of all these factors. The coupling window ground connections are very critical. The shields must have good ground contact, especially around the coupling windows, since the ground current densities are extremely high in this area. In general, the highest ground currents are found in the shield "long" walls, rather than in the "low-impedance" shorter endwalls.

Many variations in material and form factor were tested for the high frequency inductors. Cross-sectional area and surface conductivity requirements must both be satisfied to produce high Q inductors. A suitable compromise for the inductor is 0.040 inch sheet copper, gold plated to prevent oxidization. A good simulation for a working prototype may be formed from no. 12 copper wire. While very heavy copper plating is an option, thick, etched copper with a gold flash provides better performance, is inexpensive and easily fabricated.

In order to reduce stray capacitance and maintain a high filter Q, glass packaged varactor diodes 553, 573, 561, 581, 567, 589 mounted in air over the surface of the PC board, as represented by component 19 as shown in FIG. 2, rather than standard surface mount components were utilized. Each filter stage 11, 13, 15 is processor tuned by a control voltage $V_{c1}$, $V_{c2}$, $V_{c3}$ applied to the varactors on lines 14, 16, 18, respectively. Varactor bypass capacitors and chip capacitors are used in the control voltage circuit to decouple the varactor control signal.

Similarly, inductors 572, 579, 586 have their high-impedance ends terminated above the PC board, as represented by component 17 as shown in FIG. 2, as are the leaded varactors 573, 581, 589 to reduce effects of PC board stray capacitance at frequencies greater than 800 MHz. In addition, at higher tune frequencies the Q of the varactor bypass capacitors becomes significant, therefore SOT varactor diodes, 574, 582, 588 such as type BB431, are substituted to effectively lower the "tank" capacitance and the insertion loss.

RF field coupling through the shield windows 28, 38 is frequency dependent. As frequency increases, the coupling factor, and thus the gain, increases which increases the dynamic range of path attenuation. By adjusting the coupling window effective area in tandem with the filter tune frequency, the increase in filter gain can be compensated for. PIN diodes 555, 563 for the midrange filter 55 and PIN diodes 575, 583 for the high range filter 57 are connected, with bypass capacitors, across the shield coupling windows 28, 38, respectively. Since the PC board extends inside the filter cavity (as shown, in FIG. 2), i.e., the area enclosed by the shield, mounting a PIN diode physically across the coupling window opening on the top layer of the PC board will place a variable shunt within the electromagnetic field effectively allowing the window area to be modulated. The respective filter stage tune voltage is coupled to the shield PIN diodes, 555, 563, 575, 583 on lines 556, 562, 576, 584, respectively, to provide a bias current control voltage for the PIN diodes. Resistors 557, 564, 577, 585, respectively, are selected to provide an optimized bias current through the PIN diodes over the filters' frequency range. As shown in FIG. 1, variable resistor may optionally be used to provide additional adjustment of individual filter circuits. Since control of the window size will only reduce the coupling factor, the actual physical size and shape of the window is designed for optimized coupling at the low frequency end of the range for each filter section 55, 57. This technique results in a first order effect of 3 to 4 dB per coupling window. Of course, the PIN diodes could be driven by a separate circuit and DAC, but the added expense and board space may not always be warranted.

Referring now also to FIG. 4, DAC 43 comprises a CMOS four-DAC integrated circuit, such as a AD7225LP. Three of the four DACs provide a tune voltage signal for each stage, respectively, of the mid range (380-650 MHz) and high range (650-1000 MHz) tuned filters 55, 57. The fourth DAC provides a correction voltage for use elsewhere in the host instrument. Frequency tune data and DAC control signals are generated by the host instrument central processor (not shown) and input to DAC 43 on lines 431 and 433, respectively. The quad-DAC 43 includes two 8-bit registers for each DAC. The LDAC control line 437 will transfer the contents of all the first quad registers into the second registers simultaneously.

Since the LDAC line transfers all four DAC bytes at once, all filter tune signals adjust uniformly in time. The Vref voltage (+5.0 volts) on line 435 determines the maximum output voltage for the DACs, and the 0 to 255 data byte values simply scale the reference voltage. Each DAC outputs a tune signal on line 439, 441, 443, respectively, to identical varactor amplifier-driver circuits.

The DAC's 0 to +5 volt range output must be translated to a 0 to +25 volt swing to maximize the filter varactor tune range. For each amplifier circuit, an OP-amp 445 feeds a 27-volt zener diode 447 which forms a voltage step translation to allow a + -5 volt OP-amp output swing to control the varactor drive transistor 449 base voltage near +27 volts. The cathode resistor 448 sets the current through the zener diode 447 such that the diode develops about 26 volts drop thus providing a maximum output voltage of 25 volts from the varactor driver 449 for each filter stage on line 14, 16, and 18, respectively. The driver 449 output voltage is divided by 5 and used as feedback to the OP-amp 445 input thus giving the circuit a DC gain of 5. The zener diode 447 is filtered with a 1 k ohm series resistor and a 6.8 uF shunt capacitor to reduce diode noise and minimize any varactor modulation. The OP-amp 445 is also lowpass filtered with 4700 pF feedback capacitor.

The present invention has been particularly described with reference to a preferred embodiment thereof. However, it should be understood that the foregoing detailed description is only illustrative of the invention and those skilled in the art will recognize that changes in form and detail may be made without departing from the spirit of the invention or exceeding the scope of the appended claims.

I claim:

1. An RF filter comprising:
   first and second filters, each including an inductive element;
   a shield defining a coupling window positioned between the first and second filters, the shield being connected to ground, the window allowing propagation of an electromagnetic field associated with the first inductive element to the second inductive element to induce a signal therein, such propagation achieving field coupling between the first and second filters; and coupling control means for varying the field coupling between the first and second filters, said means having a capacitance that varies in response to a coupling control signal applied thereto, said means having a first terminal connected to a first side of the coupling window and having a second terminal coupled to a second side of the coupling window.

2. The filter of claim 1 in which the second terminal of the coupling control means is coupled to the second side of the coupling window through a voltage blocking capacitor.

3. The filter of claim 1 which further includes:

a third filter including an inductive element;

a second shield defining a second coupling window positioned between the second and third filters, the second shield being connected to ground, the second window allowing propagation of an electromagnetic field associated with the second inductive element to the third inductive element to induce a signal therein, such propagation achieving field coupling between the second and third filters;

means for varying the field coupling between the second and third filters, said means having a capacitance that varies in response to a coupling control signal applied thereto, said means having a first terminal connected to a first side of the second coupling window and having a second terminal coupled to a second side of the second coupling window;

a first resistance element associated with the first coupling control means for reducing a coupling control signal applied thereto; and a second resistance element associated with the second coupling control means for reducing a coupling control signal applied thereto;

at least one of said first and second resistance elements being variable.

4. The filter of claim 1 in which each filter further includes a capacitive tuning element, each capacitive tuning element having a capacitance that varies in response to a tuning control signal applied thereto.

5. The filter of claim 4 which further includes a printed circuit board to which both the capacitive tuning elements and the coupling control means are mounted.

6. The filter of claim 4 which further includes:

a microprocessor for providing digital data related to the tuning control and coupling control signals; and at least one digital-to-analog converter for converting said digital data into analog signals.

7. The filter of claim 6 which further includes an amplifier for amplifying an output signal produced by the digital-to-analog converter.

8. The filter of claim 4 in which the filters and the coupling control means permit the filter to be tuned over a 1.5:1 frequency range.

9. In a method of operating a field coupled filter, the filter having first and second stages field-coupled through an aperture in a grounded shield positioned therebetween, an improvement comprising:

electronically varying an effective size of the aperture in response to an electronic coupling control signal.

10. The method of claim 9 in which each stage includes a capacitive element responsive to a tuning control voltage, the method further including the step:

changing the tuning control voltage and the coupling control signal in tandem to change a filter frequency.

11. The method of claim 9 in which each stage includes a capacitive element responsive to a tuning control voltage, the method further including the step:

changing the tuning control voltage and the coupling control signal independently.

* * * * *